United States Patent
Rao et al.

(10) Patent No.: US 8,442,474 B2
(45) Date of Patent: May 14, 2013

(54) METHOD AND APPARATUS FOR IMBALANCE-FREE FM DEMODULATION IN DIRECT CONVERSION RADIO RECEIVERS

(75) Inventors: Yadunandana Rao, Sunrise, FL (US);
Charles R. Ruelke, Margate, FL (US);
Darrell J. Stogner, Plantation, FL (US);
Richard S. Young, Weston, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 385 days.

(21) Appl. No.: 12/844,961

(22) Filed: Jul. 28, 2010

(65) Prior Publication Data
US 2012/0028594 A1    Feb. 2, 2012

(51) Int. Cl.
*H04B 1/16* (2006.01)

(52) U.S. Cl.
USPC .......................................... 455/339; 455/307

(58) Field of Classification Search .......... 455/336–338, 455/324, 339, 306, 307; 375/152, 343, 350, 375/E1.018, E1.022
See application file for complete search history.

(56) References Cited

U.S. PATENT DOCUMENTS

| | | | |
|---|---|---|---|
| 5,042,086 A * | 8/1991 | Cole et al. | 398/188 |
| 6,580,314 B1 | 6/2003 | Deus, III et al. | |
| 8,094,763 B1 * | 1/2012 | Furman et al. | 455/339 |
| 8,204,164 B1 * | 6/2012 | Furman et al. | 455/307 |
| 2004/0218102 A1 * | 11/2004 | Dumont et al. | 455/337 |
| 2007/0086547 A1 * | 4/2007 | Sobchak et al. | 375/345 |
| 2007/0111691 A1 * | 5/2007 | Hanke et al. | 455/239.1 |
| 2010/0158175 A1 * | 6/2010 | Mergen et al. | 375/350 |

* cited by examiner

*Primary Examiner* — Lana N Le
(74) *Attorney, Agent, or Firm* — Anthony P. Curtis; Daniel R. Bestor

(57) ABSTRACT

An apparatus and method for demodulating an FM RF signal is presented. An Adaptive Differentiate Cross Multiply (ADCM) system in which the energy estimate of the desired on-channel RF is generated using adaptive filtering. The adaptive filter includes low pass filtering of the instantaneous energy estimate. The bandwidth of the LPF is adjusted in real time based on the received signal strength energy estimate, the periodicity of any changes in the energy estimate, AGC setting for the receiver, and/or the type of sub-audible signaling applied to the RF signal if known. After the bandwidth is set, the optimum filtered energy estimate is applied to the system to demodulate the received information free from distortion artifacts associated with IQ imbalance. A normalized signal in the ADCM system is clipped by a limiter whose clipping threshold is equal to a maximum gain of differentiators in the ADCM system.

20 Claims, 4 Drawing Sheets

METHOD AND APPARATUS FOR IMBALANCE-FREE FM DEMODULATION IN DIRECT CONVERSION RADIO RECEIVERS

TECHNICAL FIELD

The present invention relates to a demodulation apparatus and associated method for demodulating a received signal in a receiver in which distortion artifacts generated by phase and amplitude imbalance between the complex IQ constituent elements of the signal are minimized.

BACKGROUND

Wireless communication systems operate using information modulated onto a radio frequency (RF) carrier to form an RF signal that is subsequently transmitted over a channel. Often the RF signals are formed from in-phase (I) and quadrature-phase (Q) signal components. The RF signal is received by a radio receiver, and the modulated information contained in the RF signal is demodulated to recover the desired information. Demodulation strategies are well known in the art; however receiver topologies generally introduce noise or distortion into the demodulated signal. The amount of noise or distortion depends on the specifics of the receiver configuration and the type of information modulated into the signal.

Direct Conversion Receivers (DCRs) are incorporated into many communication systems as the receiver topology of choice because of their relatively low cost, small size, and operational flexibility over a wide range of channel spacing (i.e., the frequency difference between adjacent channels used to transmit data). A receiver is referred to as a DCR if the down conversion mixer is sourced by a Local Oscillator (LO) having a frequency approximately equal to the desired RF carrier frequency, thereby converting the received RF signal to a baseband signal. A DCR receiver may also include receiver systems where the frequency difference between the LO and the desired RF carrier signal is less than several hundred kiloHertz (kHz) which may also be called a Very Low Intermediate Frequency (VLIF) configuration for the DCR topology.

Generally, DCR topologies include baseband signal paths where the complex IQ signals from the down mixer output are further processed. In addition to distortion in the received RF signal due to DC offset errors and netting errors, because of the physical limitations intrinsic to the fabrication process of the integrated circuits forming the receiver, inter-stage mismatching, process variations, and intra-stage component tolerances of the circuits, amplitude and phase imbalances between the I and Q signal paths may be introduced into the received RF signal by the DCR. The amplitude and/or phase IQ imbalance may vary over time and temperature and thus be difficult to eliminate using direct IQ compensation techniques. The distortion products resulting from the IQ imbalance may consequently degrade the fidelity of the desired information that is modulated into the RF signal.

RF signals frequency modulated (FM) with analog voice audio (typically between 300 Hz to 3 kHz) or sub-audible signaling usually have a higher sensitivity to IQ imbalance effects than signals employing N-level binary FM coding techniques. This is due to the ability of the human ear to detect very low-level harmonic resonances, such as those that occur during unvoiced speech or between breaths, in an otherwise quieted signal. Because of the historical omnipresence of analog FM voice communication systems, many of the current and future communication systems will include analog FM voice capability so as to provide backward compatibility to legacy systems and to function as a "fail safe" means of interoperability between otherwise incompatible modulation strategies. Receivers that desire high fidelity audio while demodulating a received FM signal may be precluded from using DCR topologies due to the introduction of unacceptable audio distortion.

It is therefore desirable to have a scalable, distortion-free means of demodulating analog FM signals that is compatible with DCR topologies while being ostensibly immune to IQ imbalance so as to realize the advantages of the DCR configuration while mitigating its limitations.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts, and explain various principles and advantages of those embodiments.

Figure 1:
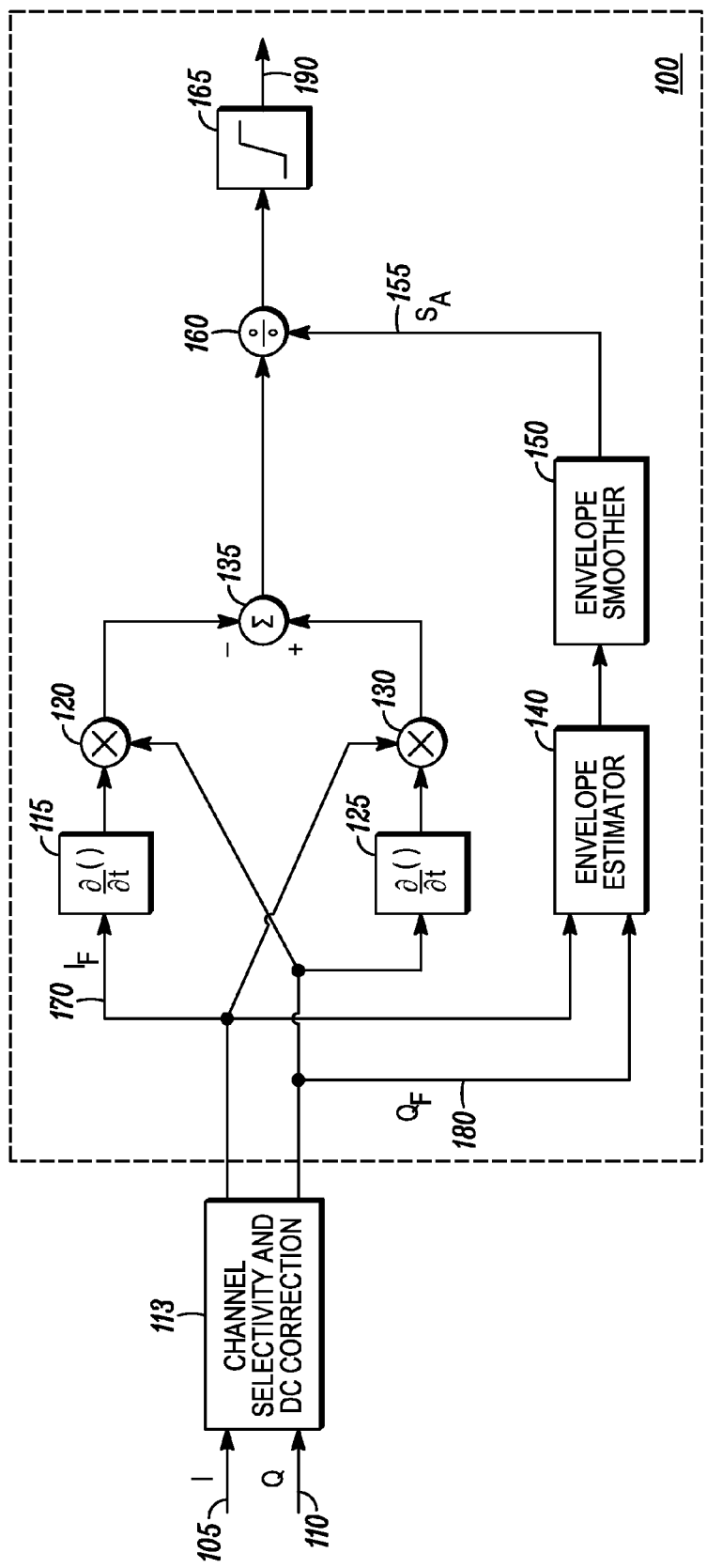
FIG. 1 depicts one embodiment of a block schematic diagram of an Adaptive Differentiate-Cross-Multiply (ADCM) system.

The apparatus and method components have been represented where appropriate by conventional symbols in the drawings, showing only those specific details that are pertinent to understanding the embodiments shown so as not to obscure the disclosure with details that will be readily apparent to those of ordinary skill in the art having the benefit of the description herein. Other elements, such as those known to one of skill in the art, may thus be present.

DETAILED DESCRIPTION

By using an Adaptive Differentiate Cross Multiply (ADCM) FM demodulation system to recover the desired information from a received FM RF signal, distortion artifacts associated with IQ imbalance can be removed. The ADCM system uses a filtering technique in which the bandwidth of the filter is varied dynamically in real time based on a given operational environment. The bandwidth is adjusted based on whether a desired on-channel signal is present, the state of the receiver, an instantaneous energy estimate of the RF signal, a periodicity of changes in the instantaneous energy estimate, a gain setting of an adjustable amplifier in the receiver, and/or if known a type of sub-audible signaling applied to the RF signal. A normalized signal in the ADCM system is clipped by a limiter whose clipping threshold is equal to a maximum gain of differentiators in the ADCM system. An Adaptive Automatic Frequency Control Controller determines whether a frequency netting error lies within an acceptable netting error range that is dependent on a LPF bandwidth setting of the filter and, if not, repeatedly scales an update rate and step size of the local oscillator used to demodulate the received RF signal based on differences between the frequency netting error and the range boundaries until the netting error is within the acceptable range.

FIG. 1 depicts one embodiment of a block schematic diagram of an ADCM demodulator system 100. As shown in FIG. 1, complex I and Q signals 105 and 110 are generated from the received RF signal (not shown) and subsequently processed in Channel Selectivity and DC Correction block 113. Complex IQ signals 105 and 110 may represent any complex signal format as may be incorporated into the receiver, for example, single-ended time varying analog signals, differential signals in which I represents signal pair I and Ix, Q represents signal pair Q and Qx, (where Ix and Qx are phase shifted from the I and Q signals by 180°), or digital representations of the sampled received IQ signals. Channel Selectivity and DC Correction block 113 attenuates undesired off-channel signals that may be included in the complex IQ signals 105 and 110, as well as removing DC offset errors that may result from parametric variations in the receiver circuits. Parametric variations that may induce DC offset errors include transistor bias variations due to temperature and/or battery changes, variations in LO energy as applied to the receiver mixer causing fluctuations in LO self-mixing, and changes in gain setting of baseband amplifier stages. Complex $I_F$ and $Q_F$ signals 170 and 180, which represent the on-channel FM signal whose information is to be extracted, are generated at the output of Channel Selectivity and DC Correction block 113 and supplied to the ADCM demodulator system 100.

In the ADCM demodulator system 100, the complex $I_F$ and $Q_F$ signals 170 and 180 are processed by the Envelope Estimator 140 to produce an estimate of the instantaneous energy of the complex IQ envelope, which is directly proportional to $(I_F^2 + Q_F^2)$. The instantaneous envelope energy resultant from Envelope Estimator 140 is then processed by Envelope Smoother 150 where it is filtered so as to provide a scalar amplitude estimate $S_A$ 155.

The Envelope Smoother 150 of FIG. 1 incorporates an adaptive filtering strategy in which the bandwidth of the filter is dynamically adjusted based on one or more system parameters. Examples of these parameters include the magnitude of the instantaneous envelope energy from the Envelope Estimator 140, the Automatic Gain Control (AGC) setting of preceding receiver blocks (shown in FIG. 2) and the periodicity of variations in the averaged envelope energy, as may result from RF multi-path or fading environments. In one embodiment, the adaptive filtering strategy in the Envelope Smoother 150 is a discrete-time digital filter in the form of a Finite Impulse Response (FIR) Low Pass filter (LPF). The FIR LPF is represented algorithmically by a series expansion of $$y[n] = \sum_{k=0}^{L-1} h(k)x[n-k],$$

where y[n] is the filtered output for sample n, L is the filter length, k is the index vector, h(k) is the $k^{th}$ filter coefficient, and x[n−k] is the received input sample of index n−k. The adaptive filter response is realized by changing the response coefficients h(k) as a function of the adjustment parameter. The filter coefficients can be chosen, for example, from a bank of pre-designed filters with different low pass frequency responses. Alternatively, a single set of filter coefficients can be used to derive other low pass filters using the well-known principles of decimation and interpolation. In one embodiment, an envelope filter with a narrow bandwidth of 200 Hz is chosen when the radio is receiving strong signal (high SNR). When the received signal strength falls below a predefined threshold, the envelope filter bandwidth is increased to 400 Hz. The new filter may be derived by decimating the 200 Hz narrow bandwidth filter by a factor of 2 and scaling to preserve the DC gain.

Although a particular discrete-time strategy has been described, other discrete time digital filter strategies may be used for the Envelope Smoother 150. Alternative discrete time digital filter configurations include, for example, an Infinite Impulse Response (IIR) LPF, IIR or FIR Band Pass filters (BPF), IIR or FIR High Pass filters (HPF), and continuous-time analog filters having an approximate response of the aforementioned discrete time digital filters. The Envelope Smoother 150 may also include a group delay compensation adjustment to align the scalar amplitude estimate $S_A$ 155 with the appropriate sample of the differentiate-cross-multiply the output signal from summer 135. Group Delay compensation may be achieved by any number of known methods, such as incorporating an all-pass filter of appropriate length in series with the envelope estimate where the filter delays or advances the envelope estimate by the appropriate number of sample clock cycles.

In tandem with the signal processing performed in the Envelope Estimator 140 and Envelope Smoother 150, complex $I_F$ and $Q_F$ signals 170 and 180 are processed in parallel to produce the numerator portion of the differentiate-cross-multiply signal. Specifically, $I_F$ signal 170 is first differentiated at differentiator 115 and subsequently multiplied by $Q_F$ signal 180 at multiplier 120. In parallel with the $I_F$ signal processing, $Q_F$ signal 180 is differentiated at differentiator 125 and subsequently multiplied by $I_F$ signal 170 at multiplier 130. The parallel processing of $I_F$ and $Q_F$ signals 170 and 180 through differentiator-multiplier pairs 115-120 and 125-130 are sample-aligned so that output of multiplier 120 is time-aligned with the output of multiplier 130. The output signals from multiplier 120 and multiplier 130 are combined at summer 135 to produce a difference value y[n] of $$y[n] = \frac{\partial Q_F[n]}{\partial t} I_F[n] - \frac{\partial I_F[n]}{\partial t} Q_F[n]$$

where n is the sample index and $I_F[n]$ and $Q_F[n]$ are signals 170 and 180 respectively.

Figure 2:
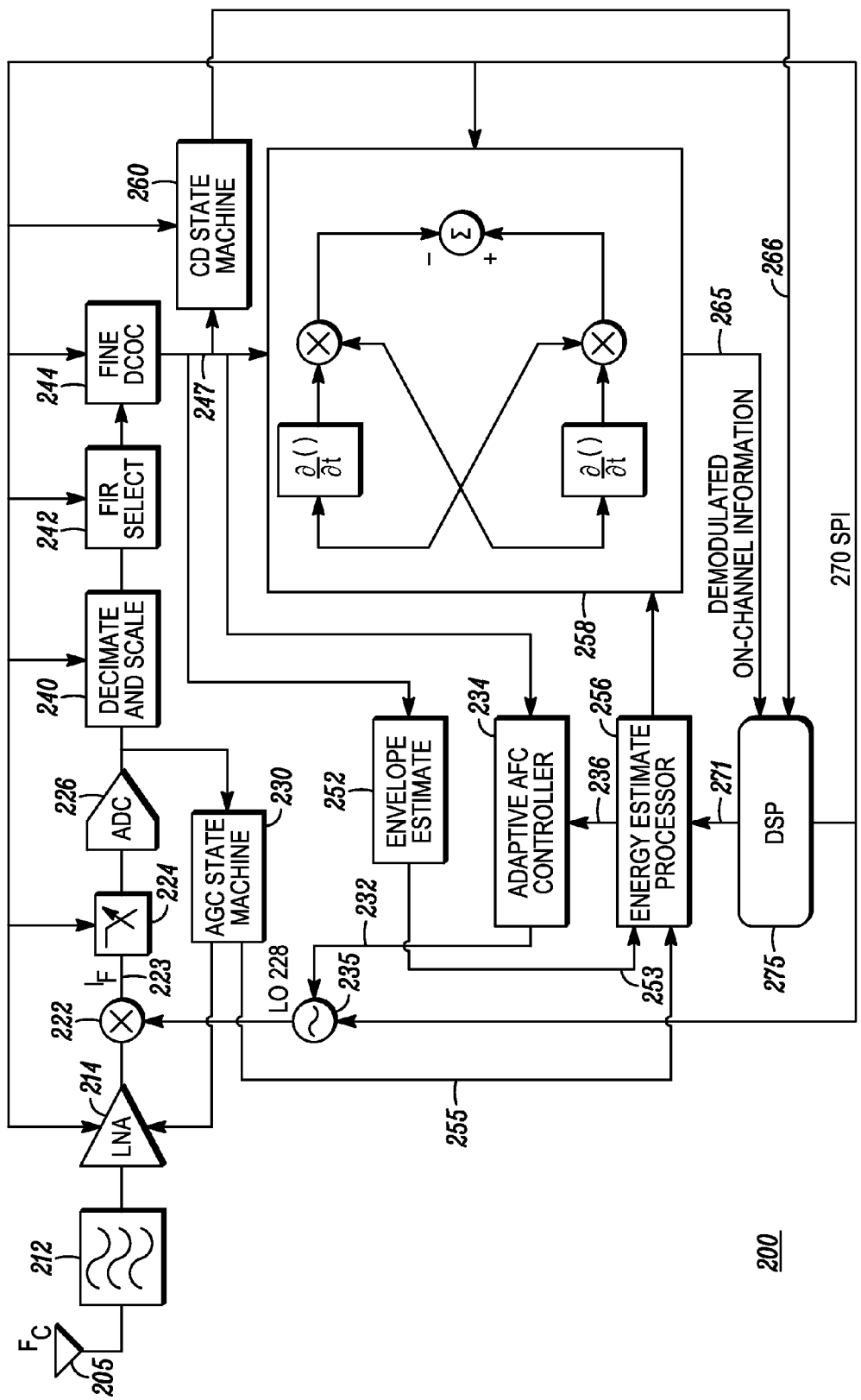
FIG. 2 depicts one embodiment of a block schematic diagram of a wireless radio receiver incorporating a DCR that includes an ADCM system.

The differentiate-cross-multiply signal from summer 135 is the un-normalized numerator value of the ADCM demodulator system 100. This value is then normalized by dividing by the scalar amplitude estimate $S_A$ 155 at divider 160. The output of divider 160, a normalized ADCM signal, is subsequently processed at limiter 165 to produce the desired information signal 190 resulting from a distortion-free ADCM demodulation of a FM signal. Limiter 165 is an adaptive non-linear clipping block designed to guarantee that the desired information signal 190 does not exceed a predefined upper and lower bound limit. In one embodiment, the clipping threshold that sets the upper and lower bound limits is adaptive and is equal to the maximum gain of the differentiators 115 and 125. The gain of each differentiator 115 and 125, which is the same, is set based on the specific protocol/channel requirements and is thus changed when changing channels or when a different protocol is used. The differentiator 115 and 125 and limiter 165 are connected to the same gain set control, e.g., a SPI setting, from a processor in the radio (as shown in FIG. 2). Differentiators 115 and 125 are designed to provide a linear frequency response versus input amplitude over a limited bandwidth of frequencies with a stop band attenuation at higher frequencies for optimum noise removal. As an example, for a receiver configured to demodulate a 25 kHz FM channel with a peak FM deviation of 5 kHz, the linear range of differentiators 115 and 125 may be set between 5-10 kHz. In another embodiment, differentiators 115 and 125 may be made selective based on the receiver configuration.

The distortion products resulting from the IQ amplitude and phase imbalance in a DCR receiver are contained in the instantaneous energy of the complex IQ envelope signal at the output of Envelope Estimator 140. The distortion effects caused by IQ imbalance are eliminated from the un-normalized numerator signal at the output of summer 135 by the intrinsic cross-multiply operations of the complex IQ signals. By exploiting the fact that the envelope response for a constant envelope FM modulated signal has a narrow low pass bandwidth, and that the imbalance artifacts fall outside of this low pass bandwidth for a chosen frequency offset (as artifacts are at twice the frequency offset), a smoothing filter may be used to filter out the undesired imbalance artifacts without appreciably affecting the desired information. This permits a distortion-free FM demodulator to be realized using an ADCM strategy. The ADCM demodulator system may also demodulate various different modulation schemes, for example, analog FM, N-level Frequency Shift Keyed (FSK) or M-ary Phase Shift Key (PSK) modulated signals.

FIG. 2 illustrates in greater detail a wireless receiver system (also referred to herein as a radio system) 200 incorporating an ADCM demodulator strategy. The receiver system 200 may be considered a Direct Conversion Receiver (DCR), although other receiver topologies may employ the ADCM strategy. The receiver system 200 includes an antenna 205 for receiving RF signals transmitted on the appropriate operational frequency range. The received signals from antenna 205 are filtered by one or more preselectors 212, only one of which is shown for convenience, to attenuate undesired RF signals that are located outside of the frequency range of interest (also called interfering RF signals). Typically, preselector 212 may utilize a band pass filter topology having a pass-band bandwidth of 5 MHz to 100 MHz or greater. If multiple preselectors are used, each may have the same or a different topology from the other preselectors. The output signal from preselector 212 is processed by a low noise amplifier (LNA) 214 having adjustable gain that amplifies the filtered RF signal. LNA 214 incorporates AGC for adjusting the gain of LNA 214 to set the output signal proportional to changes in the AGC control voltage 216. Typically, the AGC is varied to maintain a desired Signal-to-Noise Ratio (SNR) of the received RF signal to maximize the fidelity of the desired modulated information.

The amplified filtered RF signal from LNA 214 is provided to a mixer 222, which mixes the amplified filtered RF signal with a local oscillator (LO) signal 228 from an LO source 235 to generate an intermediate frequency (IF) signal 223 at the output of mixer 222. The mixer 222 down-converts the amplified filtered RF signal to an IF signal 223 composed of baseband in-phase (I) and baseband quadrature-phase (Q) signals. Only one of the quadrature signal paths is shown in FIG. 2 for convenience.

LO source 235 may include a Frequency Generation Unit (FGU), one or more Voltage Controlled Oscillator(s) (VCO), and a reference oscillator to form a closed loop Phased-Lock-Loop (PLL) system as well known in the art. As shown, LO source 235 is configurable by Serial Port Interface (SPI) 270 through which host processor (e.g., DSP) 275 controls changes in the operating frequency of the LO signal 228. Complementary to other controlling means, LO source 235 may also be adjusted by adaptive control signal 232 generated by Adaptive Automatic Frequency Control (AFC) Controller 234 (also called AFC state machine). The timing and frequency step size for any given change to the LO signal 228 is set by Adaptive AFC controller 234 through adaptive control signal 232, with each frequency update cycle being independent from that of previous changes.

The IQ signals that together comprise the IF signal 223 are subsequently processed in analog IQ processor 224 through a series of gain and filter stages to further increase the SNR of the desired on-channel signal within the received RF signal relative to the ambient noise of the receiver system. As previously described, non-ideal circuit performance within mixer 222, analog IQ processor 224, LO source 235, or other ancillary receiver blocks (not shown) may introduce distortion artifacts into the analog IF signal 223 including IQ imbalance, low frequency noise and direct current (DC) offset errors within the common mode voltages.

After processing the IF signal 223 through the IQ processor 224, the signal is digitized by an Analog-to-Digital converter (ADC) 226. ADC 226 samples the baseband analog signal (i.e., IF signal) at a predefined sample rate used to meet specific protocol requirements, thereby converting the analog received IF signal into a sampled representation of the IF signal. ADC 226 samples the analog IF signal at a rate that meets or exceeds the minimum threshold as defined by the Nyquist sampling criteria to preserve all pertinent received information within the sampled-received IF signal. The digitized sampled-received IF signals are then processed by a post-ADC Decimate and Scaling block 240 where the sampled-IF signal is enhanced by removing undesired digital distortion such as aliasing (in which undesired off-channel sampled signals may be mistaken for desired on-channel sampled signals).

In the post-ADC Decimate and Scaling block 240, various digital sub-stages (not shown) may be used to process and format the digital signals for conveyance to subsequent digital sub-stages. For example, post-ADC Decimate and Scaling block 240 may include at least one decimation block for changing an input sample rate to an output sample rate different from the input sample rate, at least one Finite Impulse Response (FIR) to minimize aliasing, Infinite Impulse Response (IIR) filters for DC offset error correction, and a formatting block that arranges the processed samples of the IQ analog signals into a predefined format.

The post-ADC sampled-IF signals may also be used as a signal source for AGC state machine 230. AGC state machine 230 adjusts the gain of various gain stages that are distributed throughout receiver system 200. Accordingly, AGC state machine 230 processes the sampled-IF signals to estimate the received RF signal level, and thereby adjust the AGC control voltage 216 to alter the gain of LNA 214 and optimize the received signal SNR. Changes in the RF received signal levels result in proportional change in the post-ADC sampled received signals. AGC state machine 230 compares the sampled receive signal level to predefined thresholds to determine how to appropriately change the gain of LNA 214. In this manner, a closed look AGC system incorporating LNA 214, ADC 226 and AGC state machine 230 is able to operate independent of, or in sequence with, other receiver sub-systems of the receiver system 200, including digital systems or demodulator strategies.

AGC state machine 230 also provides an AGC state signal 255 to Energy Estimate processor 256 to help facilitate accurate estimates of the on-channel received signal. The AGC state signal 255 may contain the current attenuation level, update timing, AGC attenuation step size, and other AGC related information as may be useful to determine a proper envelope estimate by Energy Estimate processor 256.

Although AGC state machine 230 is shown in FIG. 2 as being supplied with a signal from ADC 226, the signal provided to the input of AGC state machine 230 may be taken from other locations in the receiver system 200, e.g., any analog IQ baseband signal before ADC 226 in stages represented by mixer 222 and IQ processor 224 or any digitized sampled IQ signal after ADC 226 represented by Decimate and Scaling block 240, FIR Selectivity block 242 or DCOC block 244.

The digitized output from Decimate and Scaling block 240 is subsequently processed by Finite Impulse Response (FIR) Selectivity block 242. FIR Selectivity block 242 may be a conventional filter and provides additional off-channel signal attenuation for receiver system 200, thereby further protecting the desired on-channel signal from undesired spurious interference. After being filtered by FIR selectivity block 242, the sampled-received IF signal is compensated at DC Offset Correction (DCOC) block 244 to eliminate residual DC offset errors remaining in the desired on-channel signal. FIR selectivity block 242 and DCOC block 244 together may comprise a portion of Channel Selectivity and DC correction block 113 of FIG. 1.

The output signal 247 from DCOC block 244 is a complex IQ representation of the desired on-channel received signal received at antenna 205. The output signal 247 is also referred to herein as the complex sampled IQ signal 247. Because the complex sampled IQ signal 247 has been filtered to remove the undesired off-channel interference and residual DC offset errors, impairments introduced into the received signal by receiver system 200 may be compensated by further processing the complex sampled IQ signal 247 without limitation or interference from undesired off-channel signals. Accordingly, the complex sampled IQ signal 247 is processed in parallel operations by ADCM processor 258, CD state machine 260, Adaptive AFC controller 234, and Envelope Estimator 252.

Envelope Estimator 252 determines the instantaneous energy of the complex sampled IQ signal 247 and provides the envelope estimate 253 to Energy Estimate processor 256. Envelope Estimator 252 may correspond to Envelope Estimator 140 of FIG. 1. Energy Estimate processor 256 processes the envelope estimate 253 from Envelope Estimator 252 and the AGC state signal 255 from AGC state machine 230 to determine an accurate time-varying scalar value, which in turn is used to correctly demodulate the complex sampled IQ signal 247. Energy Estimate processor 256 may include, in part, Envelope Smoother 150 of FIG. 1; however, Energy Estimate processor 256 may augment the envelope smoother function by evaluating the AGC state signal 255 to extend the operational range of the energy estimate beyond the dynamic range limit of ADC 226. Time and amplitude variations of the AGC state signal 255 may be indicative of dynamic RF environments, such as fading or multi-path variations, which can result in erroneous envelope estimates when receiving strong signal RF for a given block of samples. Therefore, Energy Estimate processor 256 processes information in the AGC state signal 255 and the envelope estimate 253 to produce a critically damped, time varying envelope estimate. A critically damped time varying envelope estimate is an envelope estimate that converges to the correct envelope value in the shortest amount of time with minimum amplitude oscillations.

The final envelope estimate, in conjunction with the AGC state signal 255 and the envelope estimate 253, is correlated to a plurality of thresholds to determine the optimum filter response of the LPF smoothing filter as described for Envelope Smoother 150 of FIG. 1. The LPF in Envelope Smoother 150 may be realized using either digital or analog embodiments through known techniques. For digital LPF realizations, a plurality of LPF coefficients are used to set various bandwidths, with each set of coefficients being associated with a given envelope estimate threshold. For analog LPF realizations, an analog control voltage proportional to the final envelope estimate may be generated using a Digital to Analog converter (DAC) used to adjust the LPF bandwidth. In this manner the smoothing filter is dynamically configured with the appropriate filter coefficients to produce an accurate estimate of the envelope energy at the output of Energy Estimate processor 256, even when operating in extremely dynamic RF environments such as RF power fluctuations associated with RF fading responses.

ADCM processor 258 performs the actual demodulating sequences to recover the desired information from the received FM signal. Initially, ADCM processor 258 operates on the complex sampled IQ signal 247 to produce an un-normalized time-varying differentiate-cross-multiply numerator scalar proportional to the FM demodulated signal. Accordingly, ADCM processor 258 contains parallel paired differentiate-multiply blocks 115-120 and 125-130 as described in FIG. 1, as well as summer 135. In addition, ADCM processor 258 further processes the un-normalized numerator scalar signal by dividing the scalar by the envelope energy estimate provided by Energy Estimate processor 256. This division process of ADCM processor 258 corresponds to divider 160 of FIG. 1. The output of ADCM processor 258 is the demodulated on-channel information signal 265. The demodulated on-channel information signal 265 from ADCM processor 258 may correspond to signal 190 of FIG. 1 and is communicated to Digital Signal Processor (DSP) 275 for further processing as may be required such as sub-audible signaling decode, de-emphasis audio response shaping, and/or decryption ciphering.

Adaptive Automatic Frequency Control (AFC) controller 234 processes the complex sampled IQ signal 247 to determine the frequency offset error of the LO signal 228. Alternative embodiments may connect output signals from ADC 226, Decimate and Scaling block 240 and/or FIR selectivity block 242 to Adaptive AFC controller 234; however this may add further complexity in Adaptive AFC controller 234 to discriminate between undesired off-channel and desired on-channel signals when configured for these alternative embodiments.

For a DCR system, the frequency offset error is defined as the difference frequency in Hertz between the LO signal 228 and the desired on-channel RF signal received at antenna 205. For non-DCR systems, the frequency offset error is defined as the difference between the actual IF signal 223 and the desired IF frequency target value. Adaptive AFC controller 234 adjusts LO source 235 using adaptive control signal 232. By adjusting LO source 235 in the appropriate manner, Adaptive AFC controller 234 varies the LO signal 228 to minimize any frequency offset error that may be present in the IF signal 223, which is correspondingly represented in the complex sampled IQ signal 247. In this manner, a closed loop AFC system incorporating Adaptive AFC controller 234, LO source 235, mixer 222 and subsequent IF processing blocks IQ processor 224, ADC 226, Decimate and Scaling block 240, FIR Selectivity block 242, and DCOC block 244 may operate independent of, or in sequence with, other receiver sub-systems of the receiver system 200, including any digital systems or demodulator strategies.

The bandwidth of Envelope Smoother 150 of FIG. 1 incorporated into the Energy Estimate processor 256 of FIG. 2 varies dependent on the operating conditions such as channel SNR and fading conditions. Once a particular LPF bandwidth corner of Envelope Smoother 150 is selected, AFC state machine 234 automatically programs a small frequency offset into LO source 235. This offset has a lower bound set by half the low-pass bandwidth of Envelope Smoother 150. An upper bound is also enforced based on the radio configuration, which includes channel bandwidth and the type of received signal being processed (e.g., digital private line (DPL) enabled, private line (PL) enabled).

By way of example, if the envelope response signal 236 characterizes the desired on-channel signal having a SNR indicative of weak signal conditions, the LPF bandwidth of Energy Estimate processor 256 may be set wider as the ambient noise floor of the received signal will tend to mask undesired distortion artifacts associated with IQ imbalance. A new frequency error is then programmed into the LO source 235. For the special case of an all-pass LPF smoother having a low-pass bandwidth of infinity, alteration of the frequency error may be avoided. In this case, the frequency error choice becomes inconsequential due to the fact at the artifacts are buried in the high ambient thermal noise. However, if the energy estimate in the envelope response signal 236 is high, indicating strong signal operating conditions, or the envelope slope indicates that a strong signal condition will likely exist within an allotted time interval (e.g., a sample block size), the LPF bandwidth of Energy Estimate processor 256 may be set narrower (e.g., bandwidth of 200 Hz) to filter out the distortion artifacts generated by the IQ imbalance that would otherwise be present in the envelope energy estimate. In response to the strong signal condition, Adaptive AFC controller 234 programs an LO offset greater than half the bandwidth of the Envelope Smoother 150 such that the artifacts associated with the IQ imbalance will now occur outside the passband of the envelope smoother and hence get filtered out. As a causal association exists between the LPF bandwidth of Energy Estimate processor 256 and the response of Adaptive AFC controller 234, they are adjusted in real time for optimal mitigation of IQ imbalance related distortion artifacts.

The Carrier Detect (CD) state machine 260 functions as a carrier detect (CD) processor to determine if a desired on-channel signal is present. CD state machine 260 operates on the complex sampled IQ signal 247 to produce a CD indicator signal 266 that indicates to DSP 275 when a desired on-channel signal is present. This information may be used by DSP 275 to configure certain blocks within receiver system 200 to an active receive state, thereby enhancing the fidelity of the desired information modulated into the received signal. This may include reconfiguring DCOC block 244 for a higher precision for compensating DC offset error and enabling Adaptive AFC controller 234 to begin processing to determine an optimum initial compensation step for LO source 235.

DSP 275 directly or indirectly controls all radio processes and evaluates all pertinent radio information, including the demodulated on-channel information signal 265 and the CD indicator signal 266. DSP 275 may be a single processor or a plurality of specialized processors arranged to perform system maintenance while providing proper radio operation as desired by the user. In performing its functions, DSP 275 may communicate to the blocks in receiver system 200 through a Serial Port Interface (SPI) 270. DSP 275 may use the SPI 270 to dynamically configure receiver system 200 for different operating frequencies, gain settings, bandwidth setting, sample rates, or other parameters employed to function in different protocols, RF environments, or coding strategies. In addition, DSP 275 communicates to certain receiver blocks independent of the SPI 270 to ensure timely execution of particular functions. For example, although as shown DSP 275 communicates to Energy Estimate processor 256 via a dedicated signal: DSP output signal 271, DSP 275 may in addition or alternatively communicate to Energy Estimate processor 256 via SPI 270. The DSP output signal 271 can be used as a trigger signal to suspend processing by the ADCM during user initiated system changes such as a change in operating channel or protocol, or can be used to assist Energy Estimate processor 256 in selecting between groups of LPF bandwidth thresholds during dynamic operations, such a priority scan or speaker mute-to-unmute sequencing.

As shown, DSP 275 may be separate from and independent of the various post-ADC blocks shown in FIG. 2. In other embodiments, however, any or all of the post-ADC digital block functions in FIG. 2 can be incorporated into DSP 275. However, by implementing standalone, task-specific, post-ADC digital blocks as illustrated in receiver system 200, increased processing efficiency may be realized while reducing current drain as compared to implementing the same function in a generic DSP 275 which would necessitate increased mega-instructions-per-second (MIPS) and programming complexity to perform equivalent functions. As will be appreciated by those skilled in the art, the DSP affords increased flexibility as a computational platform for most algorithmic processing; however, this flexibility is realized through the use of high level instruction sets and memory management apparatus that require greater circuit complexity, with higher associated power requirements. A generic DSP architecture is thus intrinsically more complex, thereby increasing power consumption, than a simplified state machine using less complex circuits designed to perform limited computational tasks.

Figure 3:
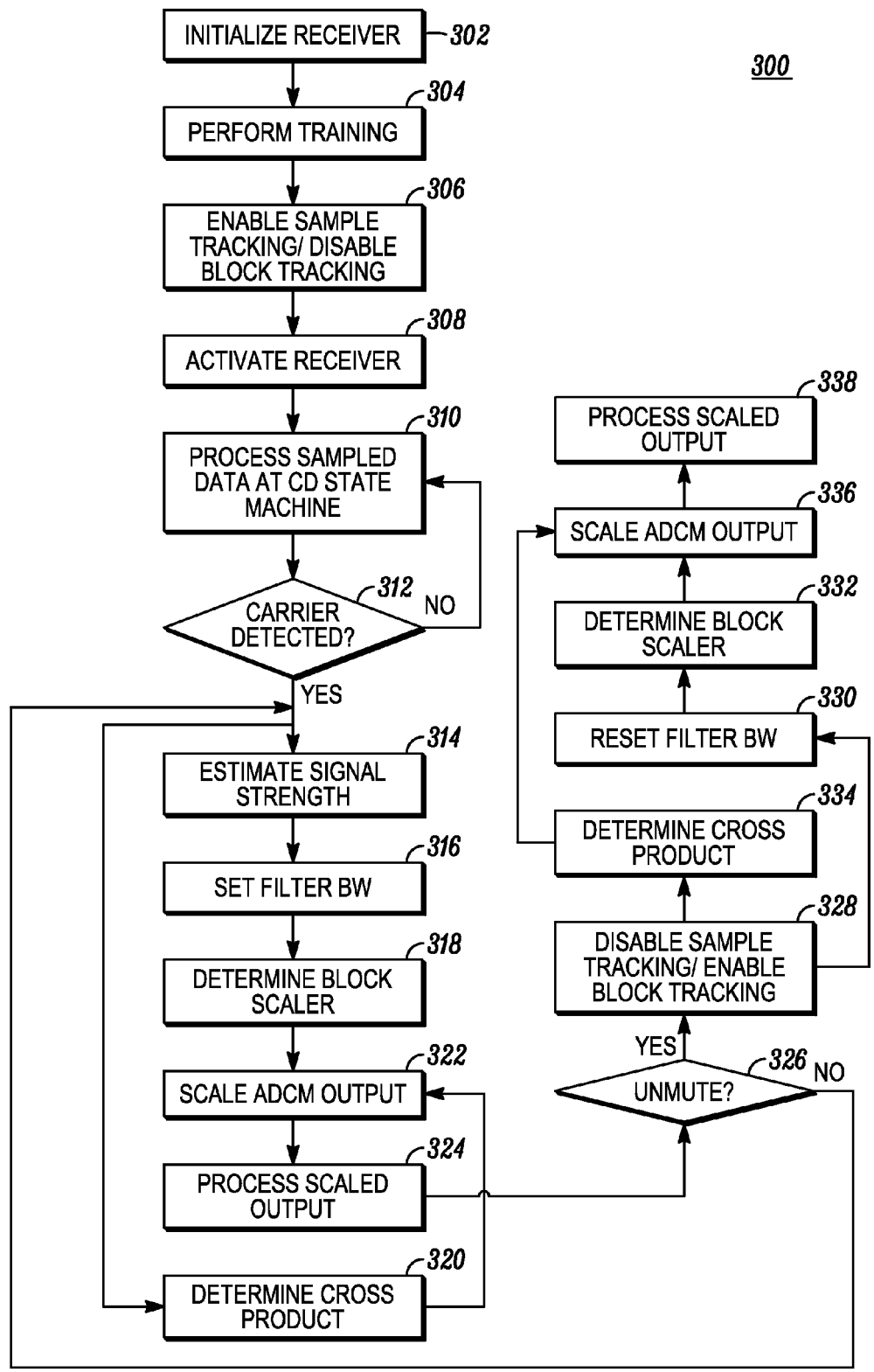
FIG. 3 depicts one embodiment of a flow chart of a method of operation for the ADCM depicted in FIG. 2.

FIG. 3 is a flow chart showing a method 300 used in operation by receiver system 200 incorporating the adaptive differentia-cross-multiply (ADCM) demodulator system 100. The method 300 begins at step 302, which initializes the receiver system 200 for start-up operation. At step 304 the DSP may initiate self-tuning (training) sequences to configure a given receive topology for optimum receive performance. These self-tuning sequences may include DC offset correction sequences to minimize DCR baseband DC offset error, Duty-cycle Adjust tuning to adjust the LO duty cycle to a targeted value such as 50%, filter tuning to compensate analog filter(s) to a predefined tolerance, or digital circuit reset sequences to ensure proper sample-time alignment.

Subsequent to training the receiver system, a protocol configuration in step 306 is initiated, indicating which protocol is to be used when operating receiver system 200 in standby mode. As used herein, standby mode is defined as any mode in which the IQ imbalance inherent in receiver system 200 does not deleteriously degrade the user perceived function of receiver system 200 (e.g., the speaker is muted so audio distortion cannot be heard). When in standby mode, the receiver may employ DC offset error correction using sample-by-sample averaging through an IIR high pass filter (HPF) which would otherwise distort the FM recovered audio (while disabling block-by-block averaging). The use of sample-by-sample IIR HPF processing may be desirable because it is easily implemented and may be more responsive to tracking out undesired DC offset errors; however, the sample-by-sample IIR HPF also tracks out desired modulated information at DC thereby inducing distortion effects that would be audible if the speaker on the radio is unmuted. Consequently, sample-by-sample IIR HPF operation is suitable when the speaker is muted (i.e., the receiver system 200 is in standby mode). When the receiver system 200 transitions to unmute the speaker, a different DC offset tracking method is employed, whereby the DC offset error is removed without eliminating the desired modulated information. Therefore, when receiver system 200 transitions from standby mode to active receive mode where the receiver system 200 is operating with the speaker unmuted, a block-by-block DC processing algorithm is used in DCOC block 244 of FIG. 2.

Then, at step 308, the Carrier Detect state machine is activated so that the on-channel sampled received data is processed at step 310. Branching from decision step 312, processing of the received sampled data resumes at step 310 from step 312 if no on-channel signal is detected. Sequencing steps 310 and 312 form a closed loop iteration for processing the sampled received data in the absence of a desired on-channel signal.

Once a desired on-channel signal is detected, step 312 branches to step 314 where the instantaneous energy estimate is determined for the on-channel received signal. The instantaneous received signal strength is a scalar value and is used, in conjunction with other metrics including AGC attenuation and RF envelope variation periodicity, to set the LPF bandwidth for filtering the instantaneous envelope estimate at step 316. At step 318 the envelope estimate is filtered for a predefined block of samples corresponding to a specific time interval. The sample block size used in step 318 is adjustable based on envelope variation periodicity, RF signal strength and/or sub-audible signaling coding. The LO source is also programmed to a desired frequency offset dependent on the bandwidth of the LPF as will be described in greater detail in reference to FIG. 4.

In parallel with step 314 through 318, sample-by-sample processing of the differentiate-cross-multiply (DCM) numerator of the complex IQ sampled receive data is performed at step 320 as described in FIG. 1. At step 322 the desired information is recovered by the ADCM demodulator by dividing the output of step 320 by the output of step 318, thereby normalizing the signal. At step 324, the DSP then processes the demodulated signal to determine if the on-channel coding requirements are met, including correlation to the sub-audible signaling encoding and other protocol specific requirements. At decision step 326, a determination is made as to whether to initiate a predefined receive channel sequence (e.g., speaker unmute, remote over the air programming, accessory sequence requirements, etc).

If the demodulated signal does not meet the channel personality requirements, which include selective speaker unmuting based on a private-line (PL) or digital private line (DPL) that are predefined into the radio host, step 326 branches back into step 314 and 320 to continue to demodulate the on-channel signal with the current receiver system configuration. Steps 314/320 through 326 form a closed loop ADCM iteration sequence for processing the on-channel signals that do not meet the required channel personality requirements for further processing.

Once the desired channel personality requirements are met by the received on-channel signal, decision step 326 branches to step 328 where certain receiver blocks may be reconfigured for optimum performance during the radio unmute operation. This may include configuring Decimate and Scaling block 240, FIR Selectivity block 242 or DCOC block 244 of FIG. 2 for increased precision to facilitate maintaining signal fidelity of the on-channel signal, for example disabling certain IIR filter processing that may induce spectral distortion while simultaneously enabling computationally intensive tracking of the DC offset error to minimize distortion artifacts.

After the digital section of the receiver system 200 is optimized for a final receive sequencing, the ADCM is again utilized to demodulate the desired on-channel information to facilitate the radio user requirements. At step 334, sample-by-sample differentiate-cross-multiply (DCM) processing of the complex IQ sampled receive data produces the ADCM numerator as described in reference to FIG. 1. In parallel with step 334, step 330 resets the envelope estimator bandwidth of the LPF to optimally filter the envelope estimate so as to remove any IQ distortion artifacts, and step 332 determines the ADCM normalizing scalar for a predefined block size by filtering the instantaneous envelope energy. The block size in step 332 and step 318, as well as the bandwidth of the envelope estimator for steps 330 and 330, are not necessarily equal and can vary independently.

At step 336, the ADCM proceeds to generate the demodulated on-channel information by dividing the DCM numerator output from step 334 by the normalizing scalar from step 332. The demodulated information from step 336 is subsequently processed at step 338 as desired by the user. This additional processing may include routing recovered audio from the demodulated FM received signal to audio processing stages for eventual transmission to the speaker.

Figure 4:
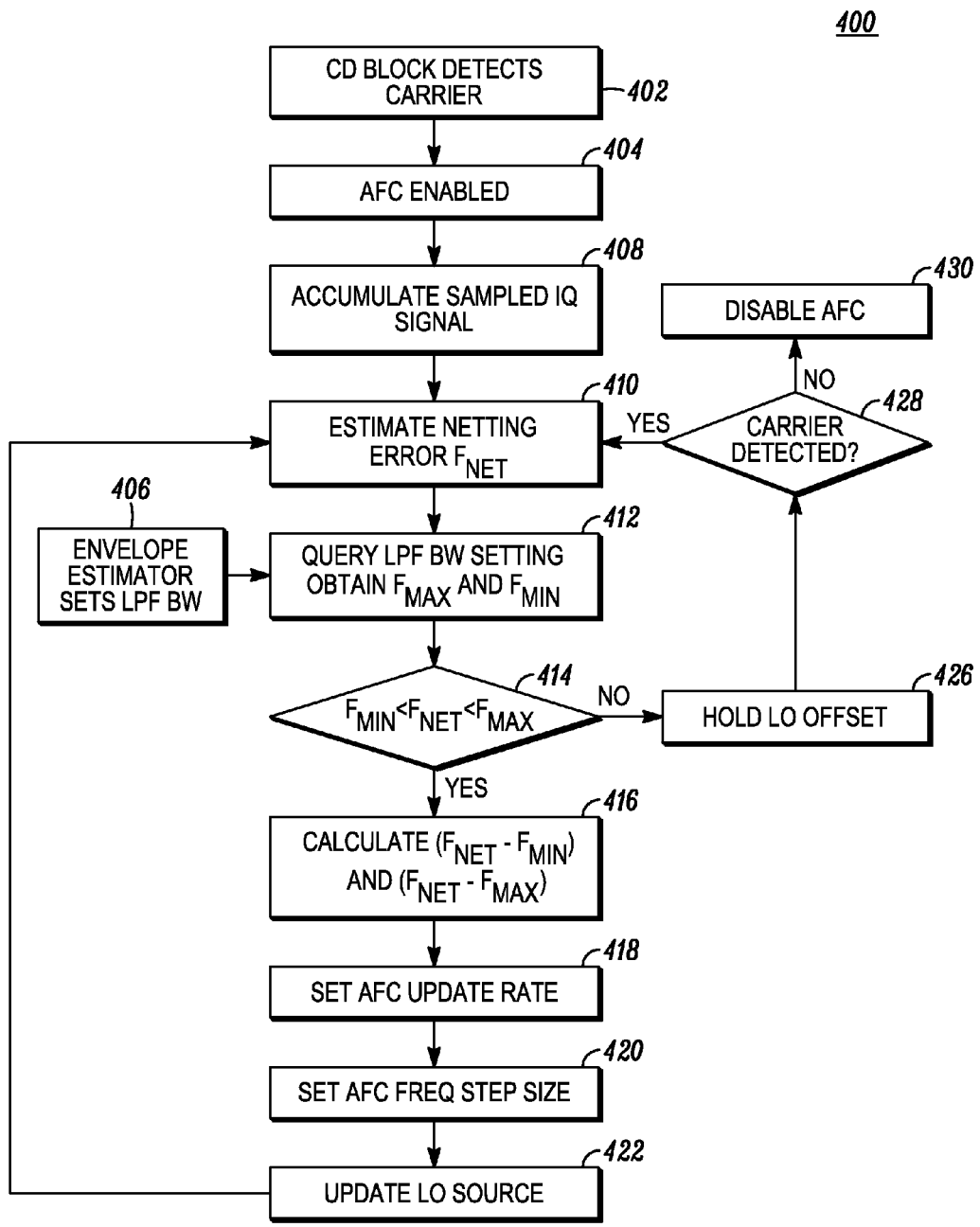
FIG. 4 depicts one embodiment of a flow chart of a method of operation for the Adaptive AFC depicted in FIG. 2.

FIG. 4 is a flow chart showing a method 400 used by Adaptive AFC controller 234 in conjunction with the Energy Estimate processor 256 incorporated into receiver system 200. The method 400 begins at step 402, where the CD state machine 260 detects an on-channel carrier and indicates the carrier status to DSP 275. Carrier Detect step 402 of flow chart 400 may correspond to step 312 of flow chart 300. The DSP subsequently enables the AFC system at step 404, after which the Adaptive AFC controller 234 begins to process the complex IQ signal at step 408. In tandem with the AFC operation at step 404 and 408, the Energy Estimate processor 256 parallel processes the instantaneous envelope energy estimates and selects a LPF bandwidth for the smoothing filter at step 406. LPF bandwidth selection step 406 is continuously iterating so as to optimize the bandwidth setting over time. Accordingly, step 406 of flow chart 400 may correspond to steps 316 and 330 of process flow chart 300.

At step 410 of flow chart 400, AFC state machine 234 calculates an initial frequency offset error estimate, also known as the frequency netting error $F_{net}$. The frequency netting error $F_{net}$ is defined as the difference between the LO frequency and the RF frequency. At step 412, the Energy Estimate processor 256 is queried and the current LPF bandwidth setting is provided from step 406. Once the LPF bandwidth is known, the AFC state machine 234 calculates an acceptable netting error range as defined by a lower netting error limit $F_{min}$ and an upper netting error limit $F_{max}$. Any estimated frequency netting error $F_{net}$ having a value that falls within the range $F_{min}<F_{net}<F_{max}$ is considered acceptable. Accordingly, at step 414, the AFC state machine 234 compares the netting error $F_{net}$ to the appropriate limits of $F_{min}<F_{net}<F_{max}$.

The lower netting error limit $F_{min}$ is selected relative to the LPF bandwidth setting at step 412. When receiving weak on-channel signals (e.g., lower SNR indicating higher ambient noise relative to the on-channel signal), the LPF bandwidth corner is generally increased and the value of $F_{min}$ may correspondingly be increased. Generally speaking, the netting error limit $F_{min}$ may be selected to be greater than or equal to about one half the LPF bandwidth setting. The netting error limit $F_{max}$ may be set such that the audio distortion products due to any residual DC error fall outside the desired audio frequency range. Higher netting error limits $F_{min}$ and $F_{max}$ facilitate faster convergence to an acceptable frequency offset error, with AFC update rates and step size being scaled accordingly. However, when receiving strong on-channel signals (e.g., high SNR), the LPF bandwidth corner is generally reduced and the value of $F_{min}$ is also reduced correspondingly.

A reduction in netting error limits $F_{min}$ and $F_{max}$ may cause the Adaptive AFC controller 234 to modify the AFC update rate and step size so to converge to the acceptable netting error range faster.

If a determination is made at decision step 414 that the current netting error $F_{net}$ is within the acceptable range, the AFC controller holds the LO source output frequency constant at step 426. In addition, the AFC controller continues to monitor the CD status at carrier detect decision step 428. Accordingly, as long as the netting error estimate $F_{net}$ is within the acceptable range and the CD state machine continues to indicate an on-channel carrier is present, steps 410, 412, 414, 426, and 428 form a passive closed loop AFC system continuously monitoring the on-channel signal metrics. If the on-channel signal is no longer present, then the carrier detect decision step 428 will branch to step 430 where upon the AFC system is disabled. During each AFC cycle through steps 410, 412, 414, 426, and 428, step 412 continuously monitors the envelope estimator LPF bandwidth such that if there is a SNR change precipitating a change in the LPF bandwidth setting, the AFC can respond appropriately. Accordingly, step 412 in AFC processing provides a complementary control of the AFC response by which the ADCM system in FIG. 1 may adapt the AFC to mitigate contributing sources of undesired distortion in the demodulated output signal.

If a determination is made at decision step 414 that the current netting error $F_{net}$ exceeds the acceptable range, the AFC controller branches to step 416 and calculates the difference values $|(F_{net}-F_{min})|$ and $|(F_{net}-F_{max})|$. The difference value from step 416 is subsequently used to scale the AFC update rate at step 418 and AFC step size at step 420. If the difference value from step 416 indicates that the netting error $F_{net}$ is significantly out of range, then the AFC update rate and step size may be increased at steps 418 and 420 respectively. Conversely, if the difference value indicates that the netting error $F_{net}$ is only slightly out of range, then the AFC update rate can be slowed down and step size decreased. Generally, the AFC step size at step 420 is scaled to be between 50% and 80% of the worst case difference values determined in step 416, with the AFC update rate ranging from 100 ms to 500 ms. For example, if the netting error estimate $F_{net}$ is 2000 Hz and the LPF bandwidth is 100 Hz, then $F_{min}$ should be at least 50 Hz. However, $F_{max}$ might be 300 Hz to ensure that audio artifacts are outside the audible range of frequencies (340 Hz-3400 Hz). Then $F_{net}-F_{max}$ is 1700 Hz and the AFC step size may be set to between 850 Hz to 1360 Hz at step 422, with an associated AFC update occurring every 100 ms at step 418. As the netting error $F_{net}$ reduces, the difference values at step 416 will reduce, resulting in a smaller AFC step size at step 420 with the update rate at step 418 being slowed down to approach 500ms. After the AFC update rate and step size is determined at step 418 and 420 respectively, the LO source is adjusted at step 422 after which the Adaptive AFC controller 234 measures a new netting error estimate $F_{net}$ at step 410. Accordingly, step 410, 412, 414, 416, 418, 420, and 422 form an active closed loop AFC system that continuously steers the LO source 235 of FIG. 2 so as to minimize the estimated netting error value $F_{net}$. Once the netting error $F_{net}$ is within an acceptable range, the AFC controller branches to the passive AFC monitoring mode at step 414.

While the ADCM demodulator is best suited for demodulating analog FM signals without introducing IQ imbalance related distortion into the recovered audio, the ADCM can be as effectively applied to any frequency or phase modulation strategy. Any degradation in receiver characteristics that may be associated with IQ imbalance that may degrade frequency modulated or phase modulated signal fidelity can be mitigated using the ADCM strategies described herein. This may include strong signal Bit-Error-Rate (BER) noise floor limitations for APCO C4FM and CQPSK, N-level FSK sequences, and trunking control channel signaling that may be limited by degraded IQ imbalance performance.

Thus, distortion artifacts associated with IQ imbalance and due to the netting error of the received RF signal relative to the local oscillator in the receiver can be removed through the use of the ADCM. The control parameters for smoothing the estimation of the RF signal (e.g., sample block size, averaging factors and filter configuration) are adjustable by a processor in the receiver based on signal and device characteristics (e.g., fading rate, signal strength, AFC and AGC responses) received by the processor. As the Envelope Smoother/normalizing low pass filter automatically adjusts the demodulated on-channel information, the use of this avoids arrangements in which the amplitude and phase errors of the I and Q components are first estimated and then used to compensate for the errors. This decreases processing and power consumption.

In various embodiments, the disclosed methods may be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

Those skilled in the art will recognize that a wide variety of modifications, alterations, and combinations can be made with respect to the above described embodiments without departing from the spirit and scope of the invention and that such modifications, alterations, and combinations are to be viewed as being within the scope of the inventive concept. Thus, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims issuing from this application. The invention is defined solely by any claims issuing from this application and all equivalents of those issued claims.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure.

The invention claimed is:

1. A method of demodulating a received radio frequency (RF) signal in an Adaptive Differentiate Cross Multiply (ADCM) system of receiver containing in-phase (I) and quadrature phase (Q) components, the method comprising:
   producing, via a normalizing filter, a normalizing estimate;
   producing, via a differentiate-cross-multiply (DCM) circuit and as a function of the I and Q components, a DCM value;
   dividing the DCM scaler value by the normalizing estimate to produce a normalized ADCM signal; and
   adjusting a filter characteristic of the normalizing filter based on at least one of a signal characteristic of the RF signal, a presence or absence of an on-channel signal, and a setting of a component in the receiver other than the normalizing filter.

2. The method of claim 1, further comprising: producing the normalizing estimate by:
   measuring an instantaneous envelope estimate of the received RF signal; and
   filtering the instantaneous envelope estimate with the normalizing filter to produce the normalizing estimate; producing the DCM scalar value by:
   differentiating the I component and multiplying the differentiated I component by the Q component to produce a first value;
   differentiating the Q component and multiplying the differentiated Q component by the I component to produce a second value;
   subtracting the first value from the second value to produce the differentiate-cross-multiply (DCM) scalar value; and
   clipping the normalized ADCM signal such that that an output of the clipping does not exceed a predefined upper and lower bound limit.

3. The method of claim 2, further comprising adapting a clipping threshold, which sets the upper and lower bound limits, to be equal to a maximum gain used in differentiating the I and Q components.

4. The method of claim 2, wherein the filter characteristic comprises a bandwidth of the normalizing filter, and wherein adjusting the bandwidth of the normalizing filter comprises selecting between groups of bandwidth thresholds during dynamic operations of the receiver.

5. The method of claim 2, wherein the filter characteristic comprises a bandwidth of the normalizing filter, and wherein the bandwidth is adjusted based on an average of the instantaneous envelope estimate.

6. The method of claim 1, further comprising adjusting an amplifier gain using an automatic gain control setting prior to adjusting the filter characteristic, wherein the filter characteristic is adjusted based on the automatic gain control setting.

7. The method of claim 1, wherein the filter characteristic comprises a bandwidth of the normalizing filter, and adjusting the bandwidth is based on detection of a desired on-channel signal.

8. The method of claim 1, further comprising determining signal characteristics of the RF signal including fading rate and a measure of signal strength, wherein the filter characteristic is adjusted in real time based on at least one of an instantaneous energy estimate of the RF signal, a periodicity of changes in the instantaneous energy estimate, a gain setting of the receiver, or a type of sub-audible signaling applied to the RF signal, the filter characteristic including at least one of a sample block size, averaging factors or a filter coefficient.

9. The method of claim 1, further comprising:
   monitoring a LPF bandwidth setting of the normalizing filter;
   selecting a lower netting error limit based on the LPF bandwidth setting;
   setting an upper netting error limit;
   calculating a frequency netting error;
   determining whether the frequency netting error lies within an acceptable netting error range bounded by the upper and lower netting error limits;
   if it is determined that the frequency netting error lies outside the acceptable netting error range, executing an active cycle that includes:
      calculating a first difference value defined by a magnitude of a difference between the frequency netting error and the lower netting error limit and a second difference value defined by a magnitude of a difference between the frequency netting error and the upper netting error limit,
      scaling at least one of an update rate or step size based on at least one of the first and second difference values,
      adjusting, by the step size, a frequency of a local oscillator used to demodulate the received RF signal, and
      repeating, dependent on the update rate, monitoring of the LPF bandwidth setting, selection of the lower frequency netting error and setting of the upper frequency netting error, determination that the frequency netting error lies outside the acceptable netting error range, and the execution of the active cycle until the netting error is determined to be within the acceptable range.

10. The method of claim 9, wherein the upper netting error limit is set such that audio distortion products due to residual DC error fall outside the upper netting error limit, and the method further comprises:

maintaining the local oscillator frequency if it is determined that the frequency netting error lies within the acceptable netting error range;

measuring an instantaneous envelope estimate of the received RF signal; and adjusting the LPF bandwidth setting dependent on the instantaneous envelope estimate such that the LPF bandwidth setting and lower frequency netting error increase with reception of on-channel signals of decreasing signal-to-noise ratio and decrease with reception of on-channel signals of increasing signal-to-noise ratio.

11. A receiver for demodulating a received radio frequency (RF) signal containing in-phase (I) and quadrature phase (Q) components, the receiver comprising:

a normalizing filter having a filter characteristic and configured to produce a normalizing estimate;

differentiate-cross-multiply (DCM) circuit configured to produce a DCM scalar value as a function of the I and Q components; and a divider configured to produce a normalized ADCM signal by dividing the DCM scalar value by the normalizing estimate;

wherein the filter characteristic is adjusted based on at least one of a signal characteristic of the RF signal, a presence or absence of an on-channel signal, and a setting of a component in the receiver other than the normalizing filter.

12. The receiver of claim 11, wherein: the receiver further comprises an Envelope Estimator coupled to the normalizing filter, the Envelope Estimator configured to estimate an instantaneous envelope estimate of the received RF signal to produce an instantaneous envelope estimate, the normalizing filter configured to filter the instantaneous envelope estimate to produce the normalizing estimate;

the DCM circuit further comprises:

a first differentiator and multiplier pair connected in parallel with the Envelope Estimator and normalizing filter, the first differentiator and multiplier pair configured to differentiate the I component and multiply the differentiated I component by the Q component to produce a first value;

a second differentiator and multiplier pair connected in parallel with the Envelope Estimator and normalizing filter and in series with the first differentiator and multiplier pair, the second differentiator and multiplier pair configured to differentiate the Q component and multiply the differentiated Q component by the I component to produce a second value; and a summer connected with the first and second differentiator and multiplier pair, the summer configured to subtract the first value from the second value to produce a differentiate-cross-multiply (DCM) scalar value;

the divider is connected with the summer and with the normalizing filter to produce the normalized ADCM signal; and the receiver further comprises a limiter having a clipping threshold and that is connected with the divider, the limiter configured to clip the normalized ADCM signal such that that an output of the limiter does not exceed a predefined upper and lower bound limit set by the clipping threshold.

13. The receiver of claim 12, wherein the limiter is further configured to adapt the clipping threshold to be equal to a maximum gain of the differentiators.

14. The receiver of claim 12, wherein the filter characteristic comprises a bandwidth of the normalizing filter and the bandwidth is selected between groups of bandwidth thresholds during dynamic operations of the receiver.

15. The receiver of claim 12, wherein the filter characteristic comprises a bandwidth of the normalizing filter and wherein the bandwidth is adjusted based on an average of the instantaneous envelope estimate.

16. The receiver of claim 11, further comprising an amplifier disposed between an antenna of the receiver and the Adaptive Differentiate Cross Multiply system, the amplifier having an adjustable gain set by an automatic gain control setting, the filter characteristic adjusted based on the automatic gain control setting.

17. The receiver of claim 11, wherein the filter characteristic comprises a bandwidth of the normalizing filter, and the bandwidth is based on detection of a desired on-channel signal.

18. The receiver of claim 11, wherein signal characteristics of the RF signal including fading rate and a measure of signal strength are determined, the filter characteristic is adjusted in real time based on at least one of an instantaneous energy estimate of the RF signal, a periodicity of changes in the instantaneous energy estimate, a gain setting of the receiver, or a type of sub-audible signaling applied to the RF signal, the filter characteristic including at least one of a sample block size, averaging factors or a filter coefficient.

19. The receiver of claim 11, further comprising an Adaptive Automatic Frequency Control Controller connected with the normalizing filter and a local oscillator source connected with the Adaptive Automatic Frequency Control Controller and used to demodulate the received RF signal, the Adaptive Automatic Frequency Control Controller configured to:

monitor a LPF bandwidth setting of the normalizing filter;

select a lower netting error limit based on the LPF bandwidth setting;

set an upper netting error limit;

calculate a frequency netting error;

determine whether the frequency netting error lies within an acceptable netting error range bounded by the upper and lower netting error limits;

if it is determined that the frequency netting error lies outside the acceptable netting error range, execute an active cycle that includes:

calculating a first difference value defined by a magnitude of a difference between the frequency netting error and the lower netting error limit and a second difference value defined by a magnitude of a difference between the frequency netting error and the upper netting error limit, scaling at least one of an update rate or step size based on at least one of the first and second difference values, adjusting, by the step size, a frequency of the local oscillator, and repeating, dependent on the update rate, monitoring of the LPF bandwidth setting, selection of the lower frequency netting error and setting of the upper frequency netting error, determination that the frequency netting error lies outside the acceptable netting error range, and the execution of the active cycle until the netting error is determined to be within the acceptable range.

20. The receiver of claim 19, further comprising an Envelope Estimator connected to the Adaptive Automatic Frequency Control Controller, the Envelope Estimator configured to measure an instantaneous envelope estimate of the received RF signal, the LPF bandwidth setting adjusted dependent on the instantaneous envelope estimate, wherein the Adaptive Automatic Frequency Control Controller is further configured to:
- set the upper netting error limit such that audio distortion products due to residual DC error fall outside the upper netting error limit;
- maintain the local oscillator frequency if it is determined that the frequency netting error lies within the acceptable netting error range; and
- adjust the lower frequency netting error such that the LPF bandwidth setting and lower frequency netting error increase with reception of on-channel signals of decreasing signal-to-noise ratio and decrease with reception of on-channel signals of increasing signal-to-noise ratio.

* * * * *